(12) United States Patent  
Tsai

(10) Patent No.: US 6,559,630 B2  
(45) Date of Patent: May 6, 2003

(54) METHOD OF MEASURING FREQUENCY OF AC POWER

(75) Inventor: Chia-Ming Tsai, Taipei (TW)

(73) Assignee: Phoenixtec Power Co., Ltd., Taipei (TW)

( * ) Notice: Subject to any disclaimer, the term of this patent is extended or adjusted under 35 U.S.C. 154(b) by 0 days.

(21) Appl. No.: 09/899,120

(22) Filed: Jul. 6, 2001

(65) Prior Publication Data

US 2003/0016003 A1 Jan. 23, 2003

(51) Int. Cl.$^7$ .............................................. G01R 23/02
(52) U.S. Cl. ................................................... 324/76.39
(58) Field of Search .......................... 324/76.39, 76.15, 324/76.17, 601, 620, 626; 702/75, 106

(56) References Cited

U.S. PATENT DOCUMENTS 4,985,843 A * 1/1991 Kotani ........................ 702/59  
6,344,749 B1 * 2/2002 Williams ..................... 324/620

* cited by examiner

*Primary Examiner*—Michael Nghiem  
(74) *Attorney, Agent, or Firm*—Rosenberg, Klein & Lee

(57) ABSTRACT

A method of measuring frequency samples a waveform, calculates waveform voltages based on an initial time base and adjust the time base for a particular waveform to determine the actual frequency of the measured AC power. A microprocessor can be used to implement the method so a small quantity of electronic elements is required, and the manufacturing cost is low.

4 Claims, 6 Drawing Sheets

SETTING AN INITIAL TIME BASE

↓

DIVIDING A CYCLE OF THE AC POWER INTO MULTIPLE PARTS

↓

CALCULATING THE VOLTAGE OF EACH PART OF THE CYCLE

↓

DETERMINING THE FREQUENCY OF THE LOCAL AC POWER PRESENT

METHOD OF MEASURING FREQUENCY OF AC POWER

BACKGROUND OF THE INVENTION

1. Field of the Invention

The present invention relates to a method of measuring frequency, and more particularly to a method of measuring frequency that is able to obtain a correct frequency reading from a distorted AC power source which includes noise, harmonics or abnormal utility waveforms.

Furthermore, a frequency detector that uses the method is able to use significantly fewer electronic components than are required in conventional frequency detectors.

2. Description of Related Art

In general, an AC power source outputs unstable power with unstable resistance of electronic equipment. Therefore, a switching power supply with angle detection and using a power source, such as utility power generator, etc., detects the frequency of the power that is usually necessary.

With reference to FIG. 5, a conventional first stage (50) of a switching power supply includes a differential circuit (51), an angle detection circuit (52) and a voltage detection circuit (53). Two input ports of the differential circuit (51) connect to the alternating current (AC) power source to compact the AC power. The output terminal of the differential circuit (51) connects to the input terminal of the angle detection circuit (52) to obtain a sample output voltage from the differential circuit (51). Then, the angle detection circuit (52) is able to calculate the frequency of the AC power by calculating the interval of two adjacent quadrilateral-wave falling/rising edges.

When the angle detection circuit (52) outputs continuous pulses, a microprocessor (not shown) determines the frequency of the AC power. However, the angle detection circuits (52) uses a comparator, and when high voltage with noise is input to the comparator, the comparator outputs a signal that includes an error pulse in the normal pulses.

Therefore, the angle detection circuit (52) is sensitive to the noise, harmonics and other abnormal utility waveforms, so that the comparator has no correction frequency detection capability.

With reference to FIG. 6, the difference between another conventional first stage (50a) of a switching power supply and the previously described conventional stable circuit is that the angle detection circuit (52a) consists of a transistor (Q) and resistors ($R_a$, $R_b$, $R_c$). The angle detection circuit is able to transform the output AC signal of the differential circuit (50) to continuous pulses. The angle detection circuit (52a) is able to perform a frequency measurement, but it also has problems such as high noise sensitivity.

To overcome the shortcomings, the present invention provides an improved method of measuring frequency to mitigate and obviate the aforementioned problems.

SUMMARY OF THE INVENTION

The objective of the present invention is to provide a method of measuring frequency, wherein the method is able to obtain highly accurate frequency measurement results without using an angle detection circuit.

A further objective of the present invention is to provide a method of measuring frequency that will be lower the manufacturing cost of the equipment.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
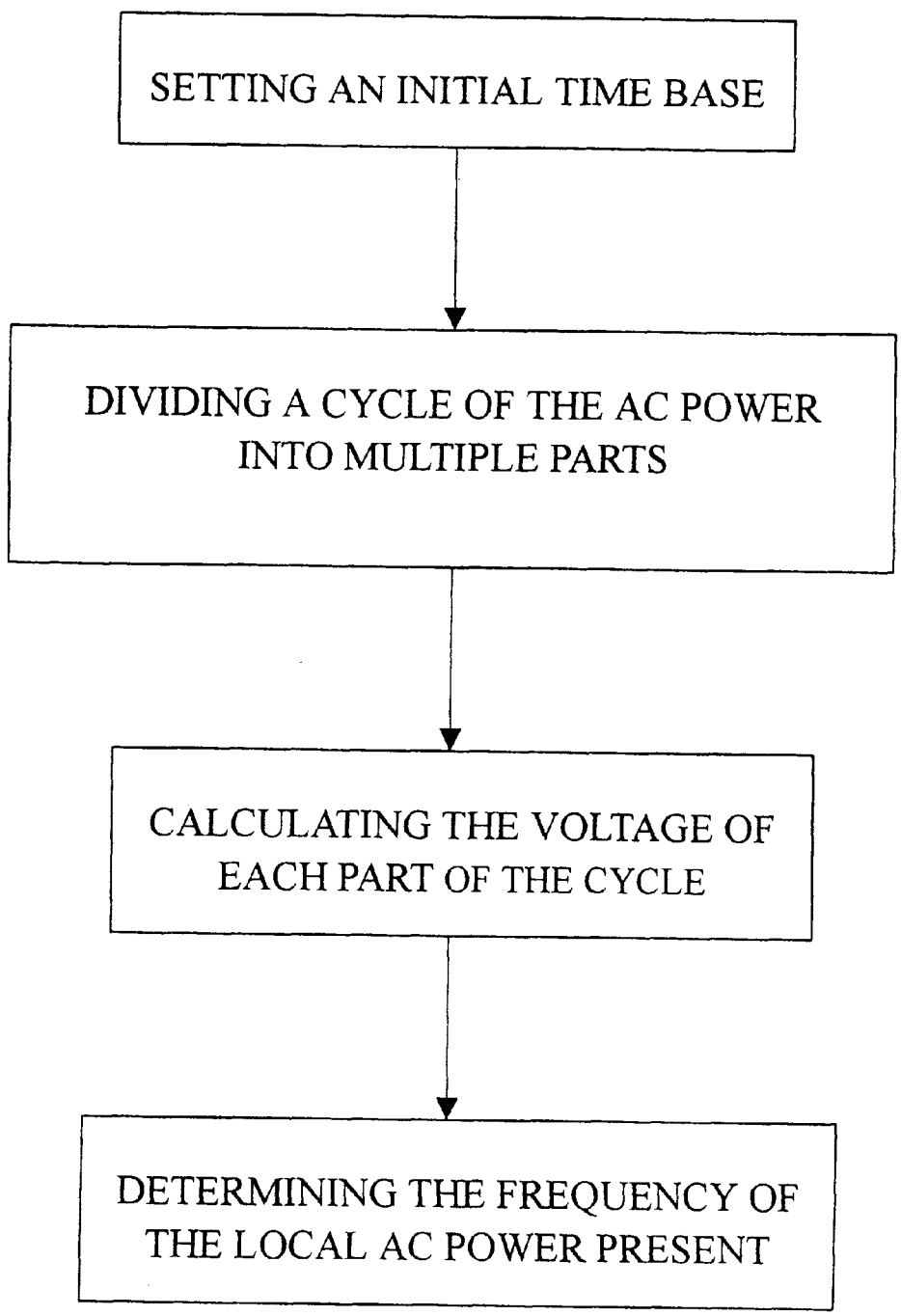
FIG. 1 is a functional block diagram of a method for measuring frequency of AC power in accordance with the present invention.

With reference to FIG. 1, a method for measuring the frequency of AC power comprises the following steps:

setting an initial time base;

dividing a cycle of the AC power present into multiple parts;

calculating the voltage of each part of the cycle; and determining the frequency of the local AC power.

In the setting an initial time base step, the normal cycle of the local alternating current (AC) power is used to set up a time base.

In the dividing a cycle of the local AC power step a sample cycle is extracted from the local AC power in accordance with the time base. Then the sample cycle is divided into multiple overlapping parts in accordance with a ratio. The overlapping parts have adjacent parts and isolated parts. The isolated parts overlap a portion of the adjacent parts. The cycle is composed of the adjacent parts. The ratio is a ratio of the isolated parts to the adjacent parts. Each part has a voltage. For example, where a cycle is divided into four segments and each part is two consecutive segments, the time of the isolated part equals the sum of half the time of the two adjacent parts. This can be further generalized by stating that the time of the isolated part overlapping two adjacent parts is equal to the sum of half the time of the adjacent parts.

In the calculating the voltage of each part step, the voltage of each part is calculated by integral calculus techniques.

In the determining the frequency of the local AC power step, a result is obtained by summing up the voltage of adjacent parts. Secondly, the result is checked to determine if it is close to zero. If the result is zero or nearly zero, the frequency measurement is equal to the reciprocal of the initial time base. If the result is not close to zero, the process is executed from the setting an initial time base step to the determining the frequency of the local AC power present step.

Figure 2:
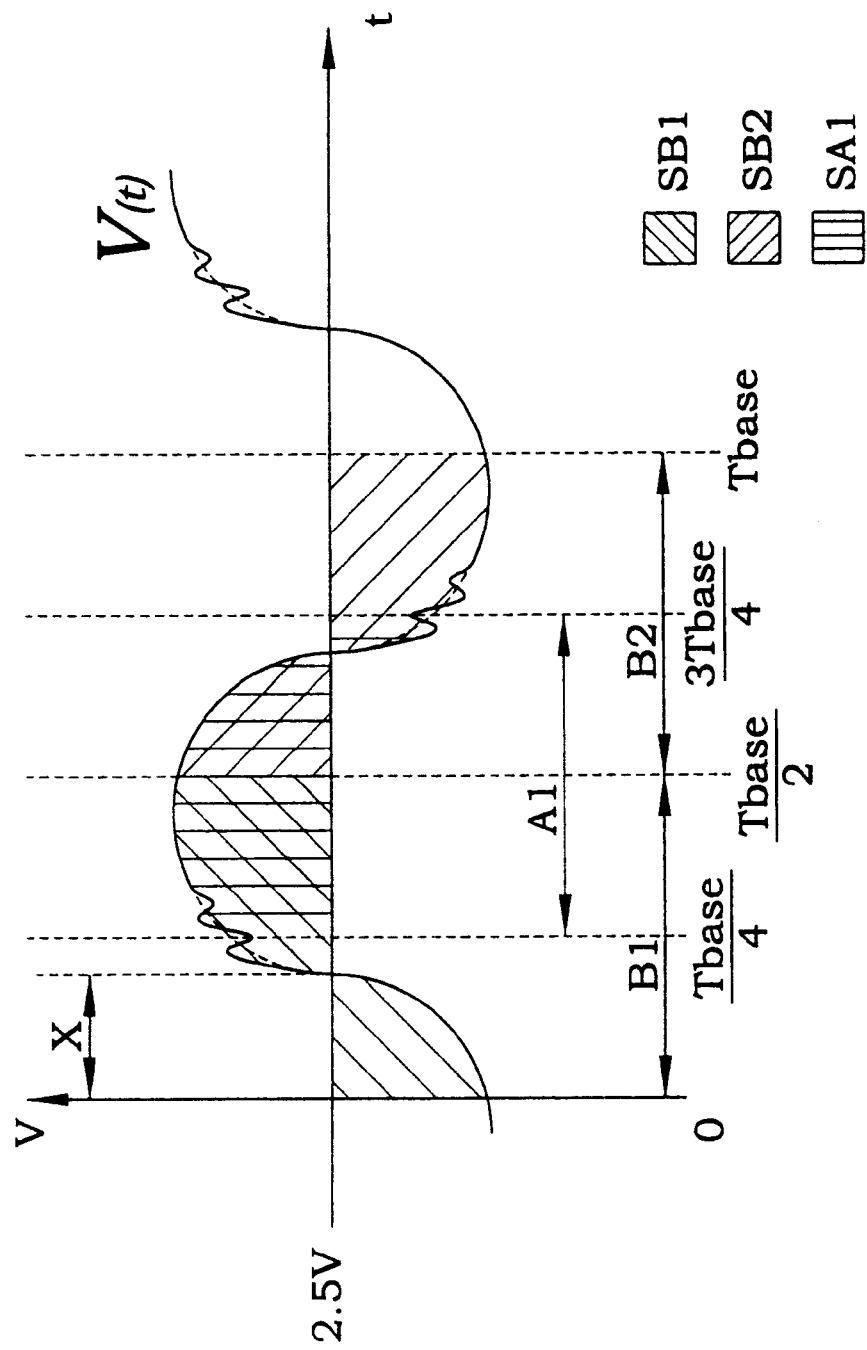
FIG. 2 is a graph of time versus voltage of a method for frequency measuring of the AC power in accordance with the present invention.

With reference to FIG. 2, a graph of time versus voltage of a normal AC power sample shows multiple parts in a sample waveform of the AC power. This graph is a particular embodiment of the method where the sample waveform is divided into four segments and three parts. Because the normal frequency of the local power supply is 50 Hz~60 Hz, the time base is set to 20 ms in the setting an initial time base step. Before executing the next step, the sample cycle is divided into multiple overlapping parts. For example, the sample cycle is divided into three overlapping parts, wherein the time of the sample cycle equals the sum of the time of the second and third parts.

Because a normal sample cycle has a negative half cycle and a positive half cycle, the sum of the voltage of a whole sample cycle should be zero. In the calculating the voltage of each part step, three voltages are calculated respectively using numeric integral calculus techniques. If the each of the two adjacent parts of the three parts is equal to half of the sample cycle, and the present sample cycle is normal, a sum of the two parts is zero. On the other hand, if the sum is not equal to or close to zero, the frequency of the local AC power is not normal.

When the sample cycle waveform includes harmonics or noise, the harmonics or noise is canceled in the sum of the voltage during the calculating the voltage step, because an area of noise is small with respect to the entire waveform and the part. Therefore, the method of detecting and calculating the frequency is able to eliminate the noise influence.

With reference to FIG. 2, the cycle waveform above with natural functions is divided into the following areas:

SA1 is the area of the voltage ($V_{(t)}$) in the part Ac between 90° and 270° of $T_{base}$, that is, the sum of the voltage between $T_{base}/4$ and $3*T_{base}/4$;

SB1 is the area of the voltage ($V_{(t)}$) in the part B1 between 0° and 180° of $T_{base}$, that is, the sum of the voltage between 0° and $T_{base}/2$; and SB2 is the area of the voltage ($V_{(t)}$) in the part B2 between 180° and 360° of $T_{base}$, that is, the sum of the voltage between $T_{base}/2$ and $T_{base}$.

$$SA1 = \int_{\frac{Tbase}{4}}^{\frac{3 \times Tbase}{4}} v(t) \times dt = \int_{\frac{Tbase}{4}}^{3 \times Tbase} \sqrt{2} \, v\sin\left(\frac{t-x}{T} \times 2\pi\right) dt$$

$$= \frac{\sqrt{2} \times V \times T}{2\pi}\left\{-\cos\left[\pi \times \left(\frac{3}{2}Y - 2\theta\right)\right] + \left[\pi \times \frac{Y}{2} - 2\theta\right]\right\}$$

$$SB1 = \int_0^{\frac{Tbase}{2}} v(t) \times dt = \int_0^{\frac{Tbase}{2}} \sqrt{2} \, v\sin\left(\frac{t-x}{T} \times 2\pi\right) dt$$

$$= \frac{\sqrt{2} \times V \times T}{2\pi}\{-\cos[\pi \times (Y - 2\theta)] + \cos[\pi \times 2\theta]\}$$

$$SB2 = \int_{\frac{Tbase}{2}}^{Tbase} v(t) \times dt = \int_{\frac{Tbase}{2}}^{Tbase} \sqrt{2} \, V\sin\left(\frac{t-x}{T} \times 2\pi\right) dt$$

$$= \frac{\sqrt{2} \times V \times T}{2\pi}\{-\cos[\pi \times (2Y - \theta)] + \cos[\pi \times (Y - 2\theta)]\}$$

Because the sample cycle waveform is divided into three parts A1, B1, and B2, three natural functions are used to respectively describe the three parts of the sample cycle waveform. Observing the above equations, a rule is defined:

$$SA1 \times \cos\left(\frac{\pi}{2} \times Y\right) = \frac{SB1 + SB2}{2}$$

and then the above equation is completed by introducing the following equation:

$$\cos \alpha \times \cos \beta = [\cos(\alpha+\beta) + \cos(\alpha-\beta)]/2$$

Thus a relationship between time base $T_{base}$ and an inverter frequency of the AC power T is obtained.

$$T_{base}/T = f/f_{base} = 2/\pi \cos^{-1}[(SB_1 + SB_2)/2SA_1]$$

Figure 3:
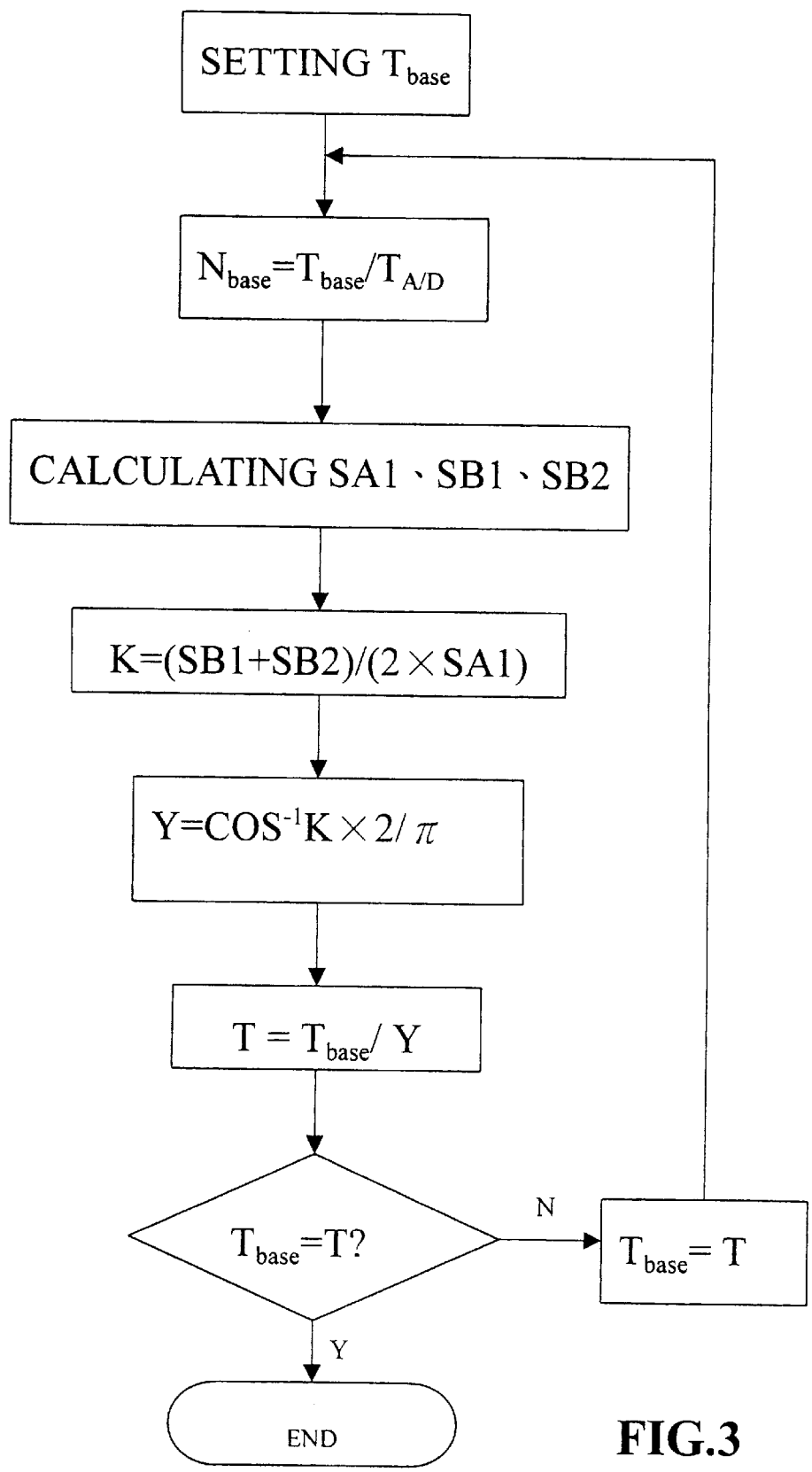
FIG. 3 is a logic diagram of the method for measuring frequency of AC power in accordance with the present invention.

With reference to FIG. 3, to begin with, an initial $T_{base}$ in accordance with the normal cycle of the local AC power is set, and a sample $T_{A/D}$ to divide an entire sample cycle is set into multiple parts. Then, the three voltages of each part SA1, SB1, and SB2 are calculated.

Per the foregoing functions, a constant k equals $(SB1+SB2)/(2*SA1)$. If the sample cycle is normal, $k=0$ is obtained because of $SB1=-SB2$. Then, due to the ratio $Y=T/T_{base}=1$, the frequency of the local AC power is normal.

If $k \neq 0$, T and the $T_{base}$ ratio Y are obtained, therefore, a new time base is able to be reset in accordance with the ratio Y. Then the setting an initial time base step of the method is executed until the ratio Y equals 1.

Figure 4:
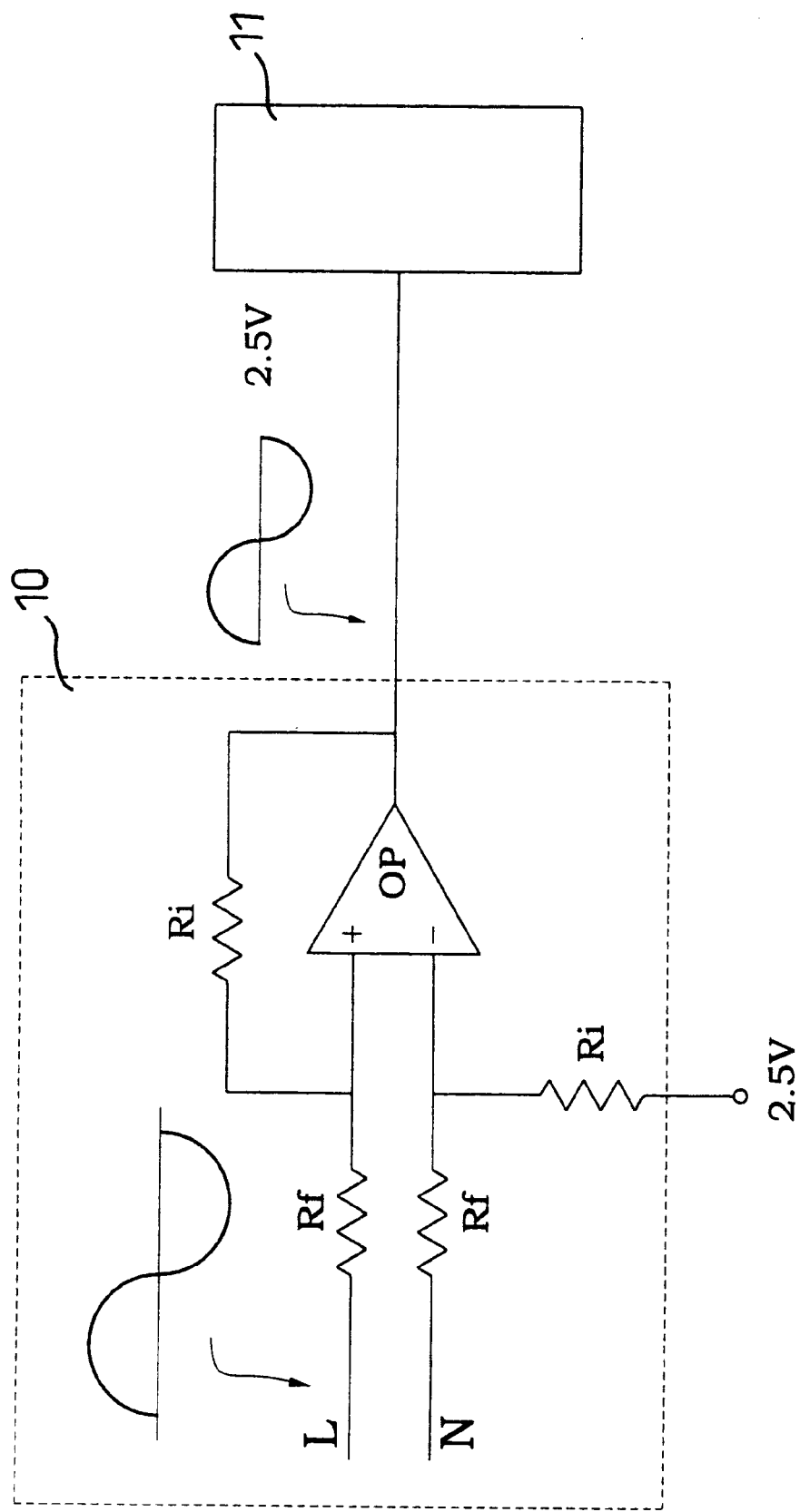
FIG. 4 is a circuit diagram of a method for measuring frequency of AC power in accordance with the present invention.
Figure 5:
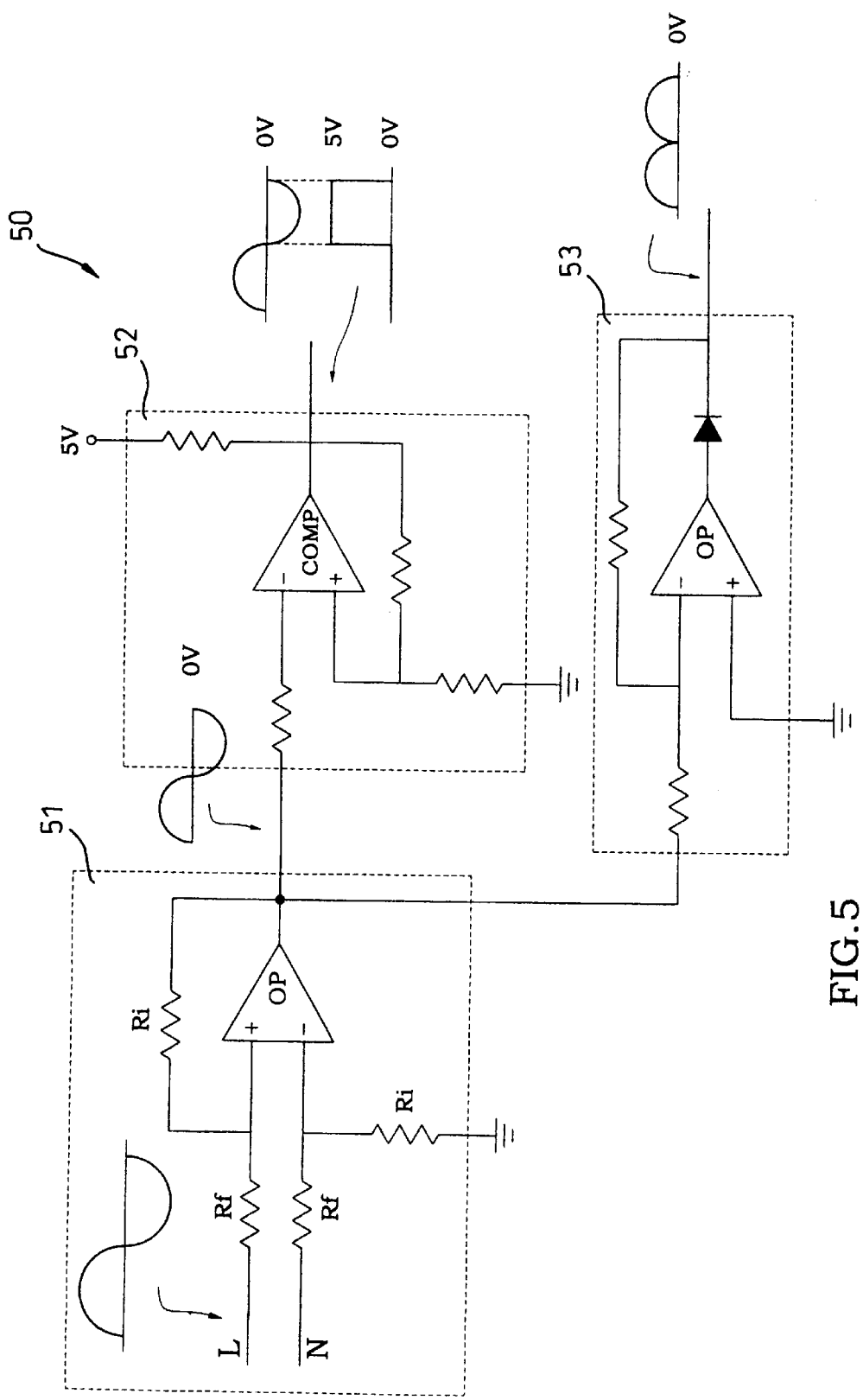
FIG. 5 is a circuit diagram of a conventional first stage of a switching power supply.
Figure 6:
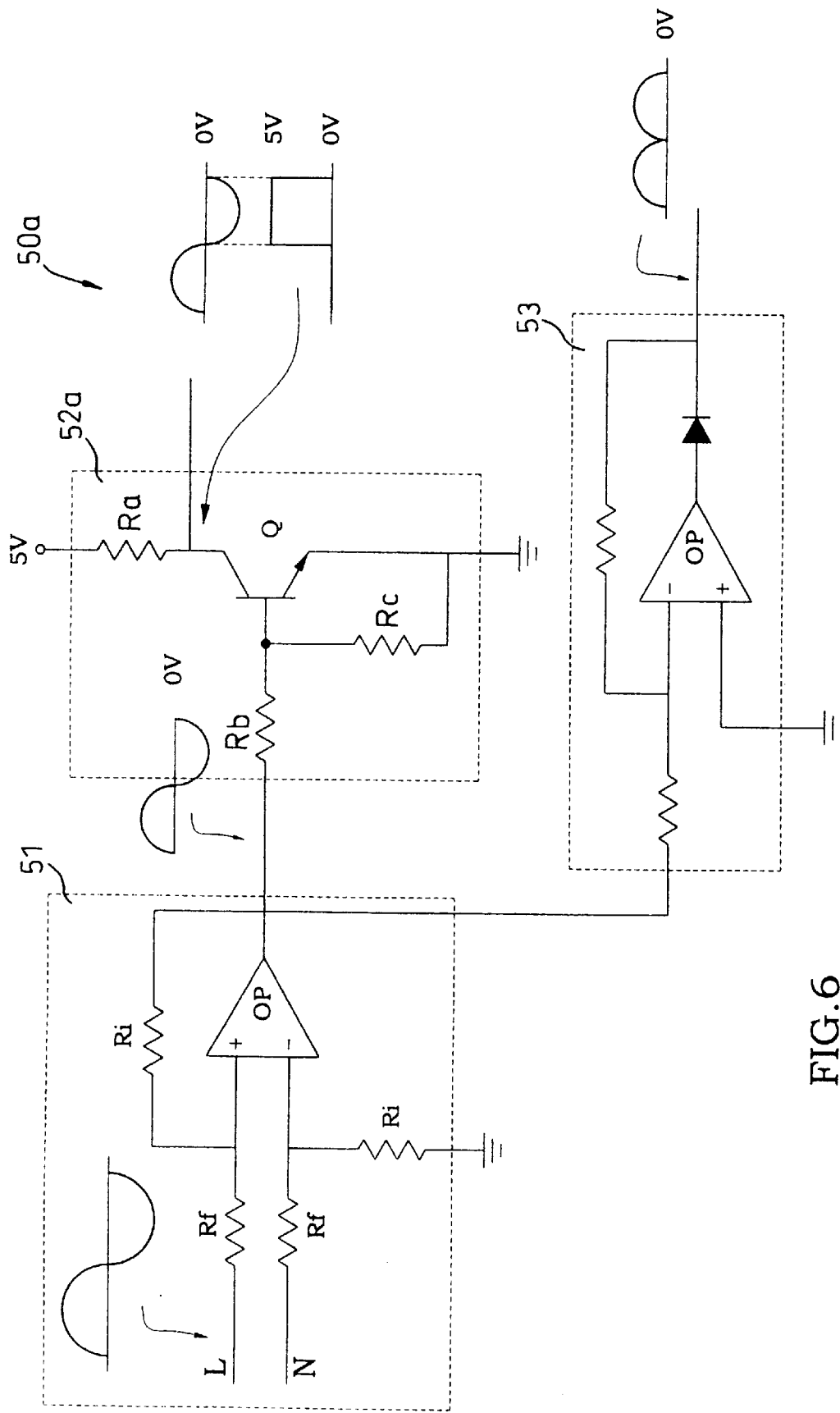
FIG. 6 is a circuit diagram of another conventional first stage of a switching power supply.

With reference to FIG. 4, the previously described process is implemented in an electronic element, such as a microprocessor (11), a signal chip, etc., with appropriate programs. Whereby, the microprocessor (11) replaces the conventional angle detection circuit to reduce the manufacturing cost.

Although the present invention has been explained in relation to its preferred embodiment, it is to be understood that many other possible modifications and variations can be made without departing from the spirit and scope of the invention as hereinafter claimed.

What is claimed is:

1. A method of measuring frequency of AC power comprise the following steps:

setting an initial time base;

dividing a cycle of the local AC power present into multiple parts;

calculating the voltage of each part of the cycle; and determining the frequency of the local AC power.

2. The method as claimed in claim 1, wherein in the setting an initial time base step, in accordance with the normal cycle of the local AC power sets up a time base.

3. The method as claimed in claim 1, wherein the local AC power is reduced to a sample cycle according to the time base in the dividing a cycle of the present local AC power step, and the cycle is divided into multiple parts in accordance with a ratio.

4. The method as claimed in claim 1, wherein a voltage of each part is calculated by integral calculus techniques in the calculating the voltage of each part step.

* * * * *

UNITED STATES PATENT AND TRADEMARK OFFICE
CERTIFICATE OF CORRECTION

PATENT NO. : 6,559,630 B2
DATED : May 6, 2003
INVENTOR(S) : Tsai

It is certified that error appears in the above-identified patent and that said Letters Patent is hereby corrected as shown below:

<u>Column 4,</u>
Lines 46-52, replace Claim 1 with the following:
-- 1. A method of measuring frequency of AC power comprising the following steps:
setting an initial time base;
dividing a cycle of the local AC power present into multiple overlapping parts having adjacent parts and isolated parts where the isolated parts overlap a portion of the adjacent parts,
    wherein the cycle is composed of the adjacent parts;
    calculating the voltage of each part of the cycle; and determining the frequency of the local AC power,
    whereby a result is calculated by summing up the voltage of each part, and the result is checked to determine whether the result is close to zero. --
Lines 57-61, replace Claim 3 with the following:
-- 3. The method of measuring frequency of AC power as claimed in Claim 1, wherein the local AC power is reduced to a sample cycle according to the time base in the dividing a cycle of the present local AC power step, and the cycle is divided into multiple parts in accordance with a ratio of the isolated parts to the adjacent parts. --

Signed and Sealed this

Nineteenth Day of August, 2003

JAMES E. ROGAN
*Director of the United States Patent and Trademark Office*